(12) United States Patent
Kim et al.

(10) Patent No.: US 12,542,228 B2
(45) Date of Patent: Feb. 3, 2026

(54) DIE ALIGNMENT METHOD USING MAGNETIC FORCE

(71) Applicant: SAMSUNG ELECTRONICS CO., LTD., Suwon-si (KR)

(72) Inventors: Sumin Kim, Hwaseong-si (KR); Minwoo Rhee, Seoul (KR); Yongchul Shin, Hwaseong-si (KR); Ilyoung Han, Uiwang-si (KR); Nungpyo Hong, Goyang-si (KR); Seungdon Lee, Seongnam-si (KR); Kyeongbin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 606 days.

(21) Appl. No.: 18/075,814

(22) Filed: Dec. 6, 2022

(65) Prior Publication Data
US 2023/0178280 A1 Jun. 8, 2023

(30) Foreign Application Priority Data
Dec. 8, 2021 (KR) .................... 10-2021-0174778

(51) Int. Cl.
*H01F 13/00* (2006.01)
*H01L 23/00* (2006.01)
*H01L 25/00* (2006.01)

(52) U.S. Cl.
CPC ........... *H01F 13/00* (2013.01); *H01L 23/564* (2013.01); *H01L 25/50* (2013.01)

(58) Field of Classification Search
CPC ...... H01F 13/00; H01F 7/0247; H01F 13/003; H01L 23/564; H01L 25/50; H01L 23/562; H01L 2225/06593; H01L 25/0657; H01L 2223/54426; H01L 23/544; H01L 24/82; H01L 2224/82143; H01L 2225/06513
See application file for complete search history.

(56) References Cited

U.S. PATENT DOCUMENTS

| 6,049,974 A | 4/2000 | Asanasavest |
| 8,138,868 B2 * | 3/2012 | Arnold .................... B81C 3/002 29/729 |
| 8,789,267 B2 | 7/2014 | Peng et al. |
| 9,007,085 B2 | 4/2015 | Seo |
| 9,012,265 B2 | 4/2015 | Yi et al. |

(Continued)

FOREIGN PATENT DOCUMENTS

| JP | 2003-203952 | 7/2003 |
| KR | 10-2006-0109597 | 10/2006 |
| KR | 10-0713579 | 4/2007 |

(Continued)

*Primary Examiner* — Mohamad A Musleh
(74) *Attorney, Agent, or Firm* — Morgan, Lewis & Bockius LLP

(57) ABSTRACT

A die alignment method includes vertically aligning a first die comprising first magnetic patterns and a second die comprising second magnetic patterns with each other using magnetic force between the first magnetic patterns and the second magnetic patterns. Each of the first magnetic patterns and the second magnetic patterns comprises a horizontally magnetically anisotropic material. The first magnetic patterns and the second magnetic patterns do not vertically overlap each other when the first die and the second die are vertically aligned with each other.

7 Claims, 11 Drawing Sheets

(56) References Cited

U.S. PATENT DOCUMENTS

2005/0007228 A1\* 1/2005 Wright ................. H01F 7/1646
335/220
2015/0022298 A1\* 1/2015 Fullerton ............... G01D 18/00
335/284

FOREIGN PATENT DOCUMENTS

| KR | 10-0958654 | 5/2010 |
| KR | 10-2021-0056101 | 5/2021 |

\* cited by examiner

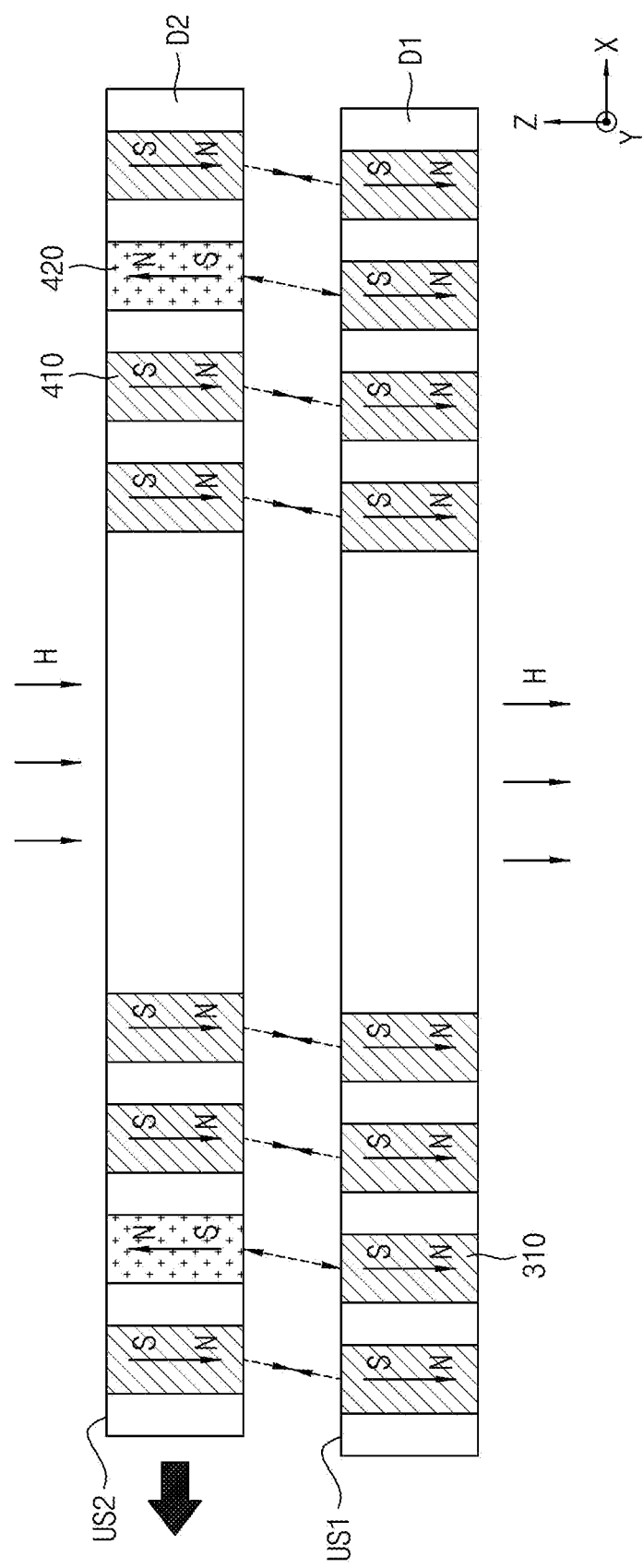

DIE ALIGNMENT METHOD USING MAGNETIC FORCE

CROSS-REFERENCE TO THE RELATED APPLICATION

This application claims priority under 35 U.S.C. § 119 to Korean Patent Application No. 10-2021-0174778, filed on Dec. 8, 2021 in the Korean Intellectual Property Office, the disclosure of which is incorporated by reference in its entirety herein.

1. TECHNICAL FIELD

The embodiments of the disclosure relate to a die alignment method using magnetic force, and more particularly to a die alignment method for aligning dies including a ferromagnetic material.

2. DISCUSSION OF RELATED ART

In the field of 3D packaging, which is a semiconductor post-process, a polymer film including an adhesive component for bonding is typically disposed between two dies or between a die and a substrate. However, die-to-wafer (D2W) hybrid bonding technology for plasma-processing a surface of a die or a substrate has recently been developed to provide direct bonding without using an adhesive film for realizing a high-density interconnection. In such D2W hybrid bonding technology, there should be a high accuracy of alignment between dies.

As an integration level of a device increases, the thickness of the device is further reduced. Due to such a reduction in thickness, a die warpage phenomenon may occur in a procedure of moving a die to achieve die alignment.

SUMMARY

Embodiments of the present disclosure provide a die alignment method capable of preventing occurrence of a die warpage phenomenon while increasing accuracy of alignment between dies.

According to an embodiment of the present disclosure, a die alignment method includes vertically aligning a first die comprising first magnetic patterns and a second die comprising second magnetic patterns with each other using magnetic force between the first magnetic patterns and the second magnetic patterns. Each of the first magnetic patterns and the second magnetic patterns comprises a horizontally magnetically anisotropic material. The first magnetic patterns and the second magnetic patterns do not vertically overlap each other when the first die and the second die are vertically aligned with each other.

According to an embodiment of the present disclosure, a die alignment method includes providing a first die comprising first magnetic patterns and second magnetic patterns. A second die is provided on the first die. The second die comprises third magnetic patterns and fourth magnetic patterns. The first die and the second die are vertically aligned with each other using repulsive force between the first magnetic patterns and the third magnetic patterns and attractive force between the second magnetic patterns and the fourth magnetic patterns. The first magnetic patterns and the third magnetic patterns comprise a semi-hard magnetic material. The second magnetic patterns and the fourth magnetic patterns comprise a soft magnetic material or a hard magnetic material.

According to an embodiment of the present disclosure, a die alignment method includes providing a first die comprising first magnetic patterns. A second die comprising second magnetic patterns and third magnetic patterns is moved to be adjacent to the first die. The first die and the second die are vertically aligned with each other using attractive force between the first magnetic patterns and the second magnetic patterns. Repulsive force is exerted between the first magnetic patterns and the third magnetic patterns when the first die and the second die are vertically aligned with each other. The first magnetic patterns and the second magnetic patterns comprise a ferroelectric material. The third magnetic patterns comprise a diamagnetic material.

BRIEF DESCRIPTION OF THE DRAWINGS

FIG. 11 is a cross-sectional view of a method for aligning a first die and a second die with each other through application of a magnetic field in accordance with an embodiment of the present disclosure.

DETAILED DESCRIPTION OF EMBODIMENTS

Figure 1:
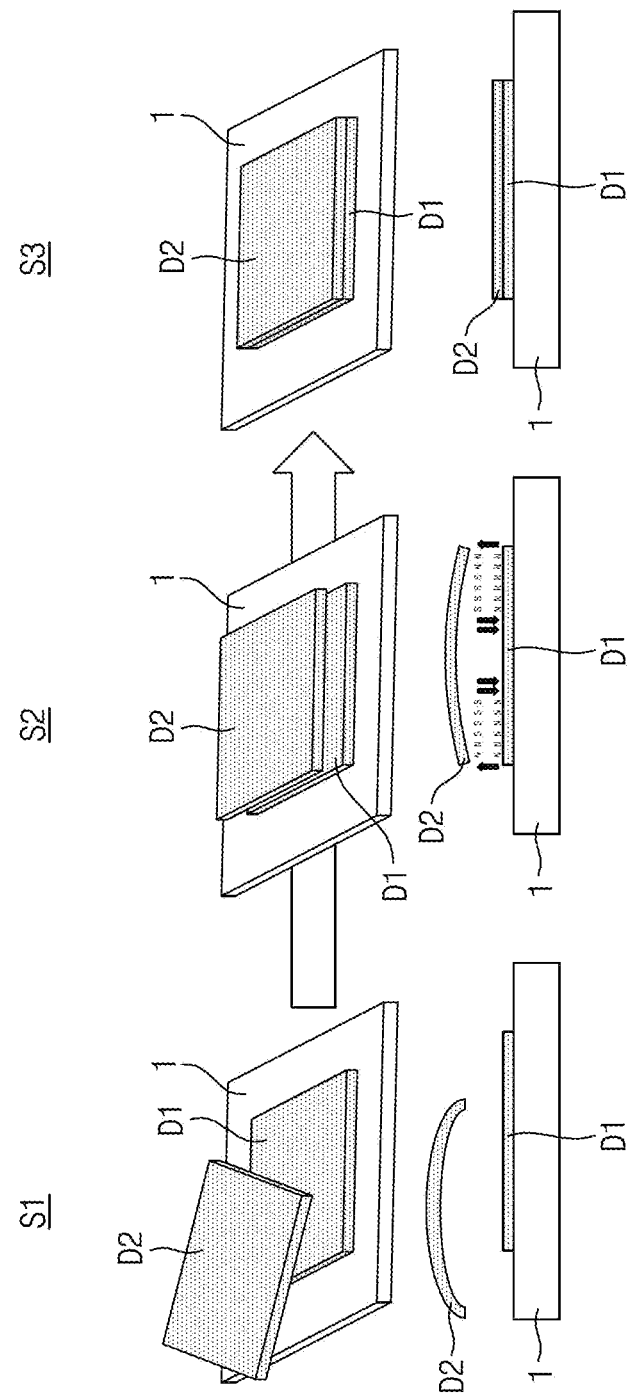
FIG. 1 is a perspective view of a die alignment method according to an embodiment of the present disclosure.

FIG. 1 is a view explaining a die alignment method according to an embodiment of the present disclosure.

Referring to an embodiment of FIG. 1, the die alignment method may include moving a second die D2 to be adjacent to a first die D1 in step S1, applying a magnetic field to the first die D1 and the second die D2, thereby aligning the first die D1 and the second die D2 with each other in step S2, and bringing the first die D1 and the second die D2 into direct contact with each other after alignment between the first die D1 and the second die D2 in step S3.

In an embodiment, the first die D1 may be provided over a stage 1. In an embodiment, the stage 1 may function to support a wafer or dies singulated from a wafer through cutting of the wafer. For example, the first die D1 may be a portion of a wafer, or may be one semiconductor chip singulated from the wafer. For example, the wafer and the first die D1 may include a circuit layer including a transistor, and a through electrode electrically connected to the circuit layer. The first die D1 may be directly disposed on the stage 1, or may be disposed on a wafer disposed on the stage 1.

In an embodiment, the second die D2 may be moved to be adjacent to the first die D1 in step S1. The second die D2 may be one semiconductor chip singulated from a wafer through cutting of the wafer. The second die D2 may have a configuration identical or similar to that of the first die D1. For example, in an embodiment the second die D2 may be moved by a pick-up tool capable of picking up the second die D2. However, embodiments of the present disclosure are not necessarily limited thereto. After picking up the second die D2, the pick-up tool may move the second die D2 to a position where at least a portion of the second die D2 vertically overlaps with the first die D1.

After movement of the second die D2 to be adjacent to the first die D1, a magnetic field may be applied to the first die D1 and the second die D2, thereby aligning the first die D1 and the second die D2 with each other in step S2. For example, in an embodiment the magnetic field may be generated by disposing a solenoid coil around the first die D1 and the second die D2, and flowing current through the solenoid coil. However, embodiments of the present disclosure are not necessarily limited thereto. The first die D1 and the second die D2 may be disposed within the magnetic field. Each of the first die D1 and the second die D2 may include magnetic patterns including a magnetic material and, for example, the magnetic patterns may include a ferroelectric material. The magnetic patterns may be magnetized by a magnetic field. As the magnetic patterns are magnetized, the magnetic patterns may exhibit polarities and, as such, may have an N pole and an S pole. As the magnetic patterns have polarities, magnetic forces, such as attractive force and repulsive force, may be exerted between the magnetic patterns included in the first die D1 and the magnetic patterns included in the second die D2, and the first die D1 and the second die D2 may be aligned to vertically completely overlap each other through the attractive force and the repulsive force in step S2. As the first die D1 and the second die D2 are aligned with each other, the second die D2 may be disposed on an upper surface of the first die D1 in step S3. In an embodiment, alignment of the first die D1 and the second die D2 and the disposing of the second die D2 on the first die D1 may be substantially simultaneously achieved. In an embodiment, alignment of the first die D1 and the second die D2 may include forcing the first die D1 to vertically completely overlap with the second die D2 and, at the same time, forcing the second die D2 to be directly disposed on the first die D1.

In an embodiment, the first die D1 and the second die D2 may be vertically spaced apart from each other in a state in which the first die D1 and the second die D2 are vertically aligned with each other by magnetic forces. In a state in which the first die D1 and the second die D2 are vertically spaced apart from each other while being vertically aligned with each other, the second die D2 picked up by the pick-up tool may be released from the pick-up tool, thereby causing the second die D2 to be directly disposed on the first die D1, or the second die D2 may be moved to be brought into direct contact with the first die D1 by the pick-up tool.

Figure 2:
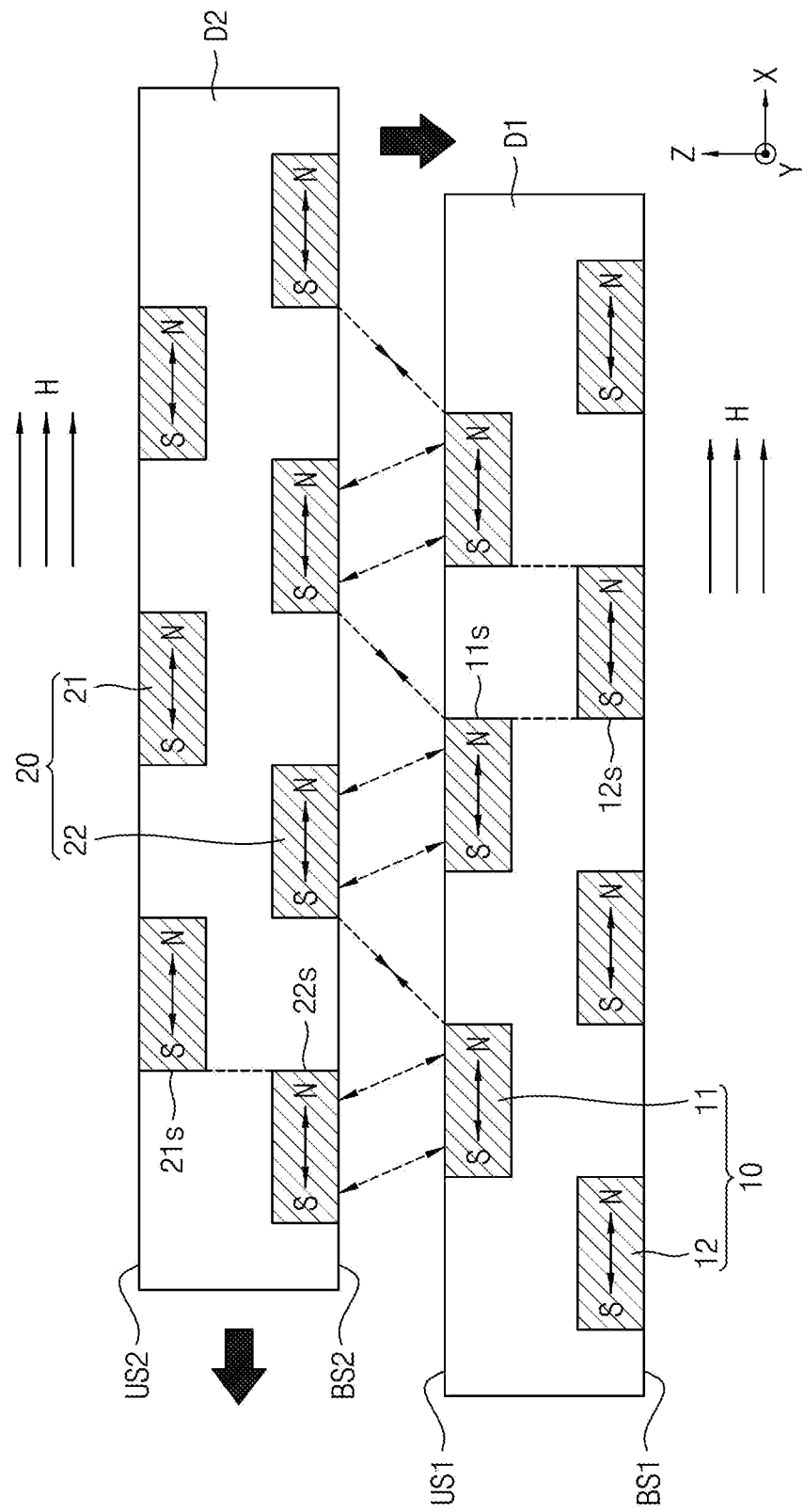
FIGS. 2 and 3 are cross-sectional views of a method for aligning a first die and a second die with each other through application of a magnetic field in accordance with embodiments of the present disclosure.
Figure 3:
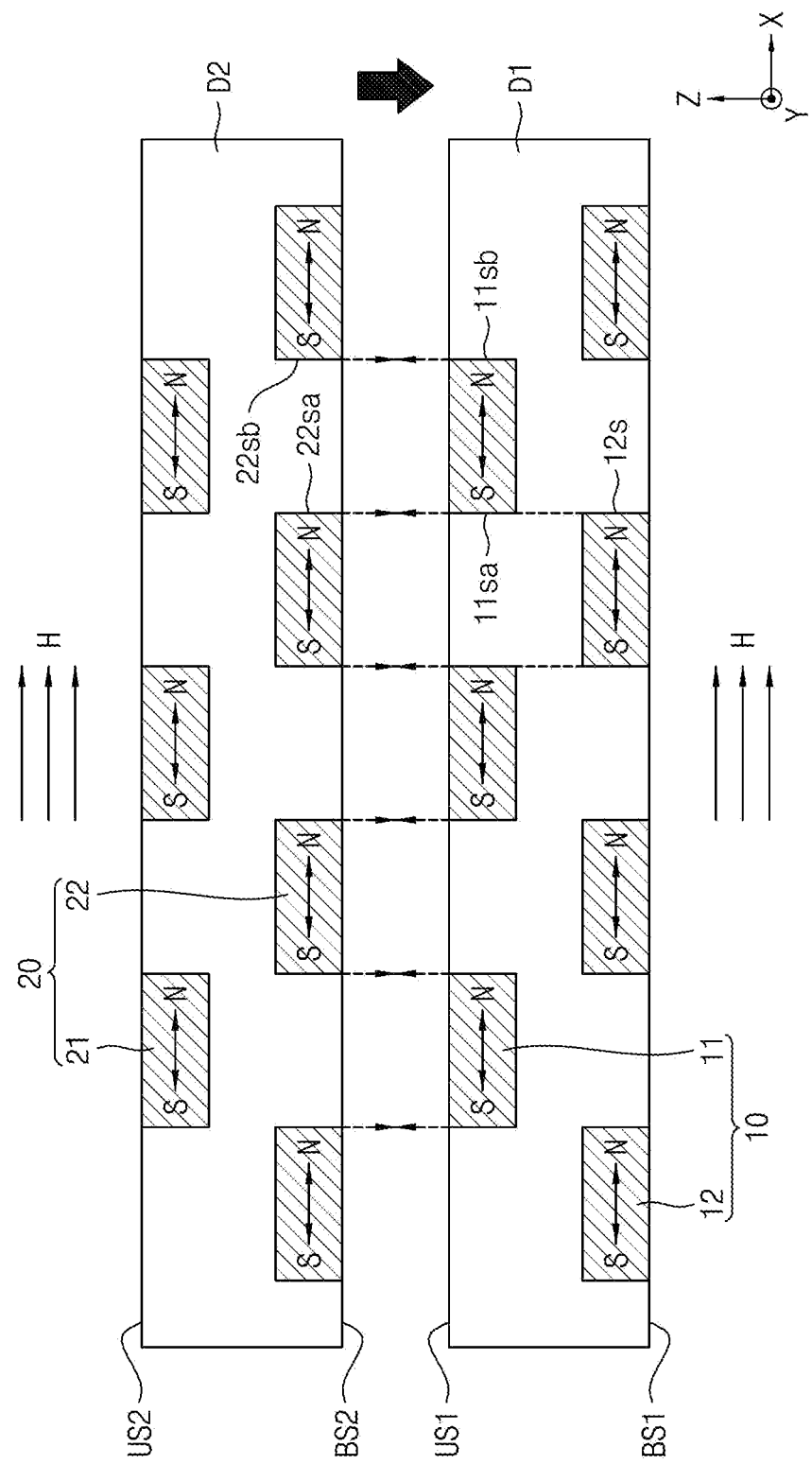
Figure 4:
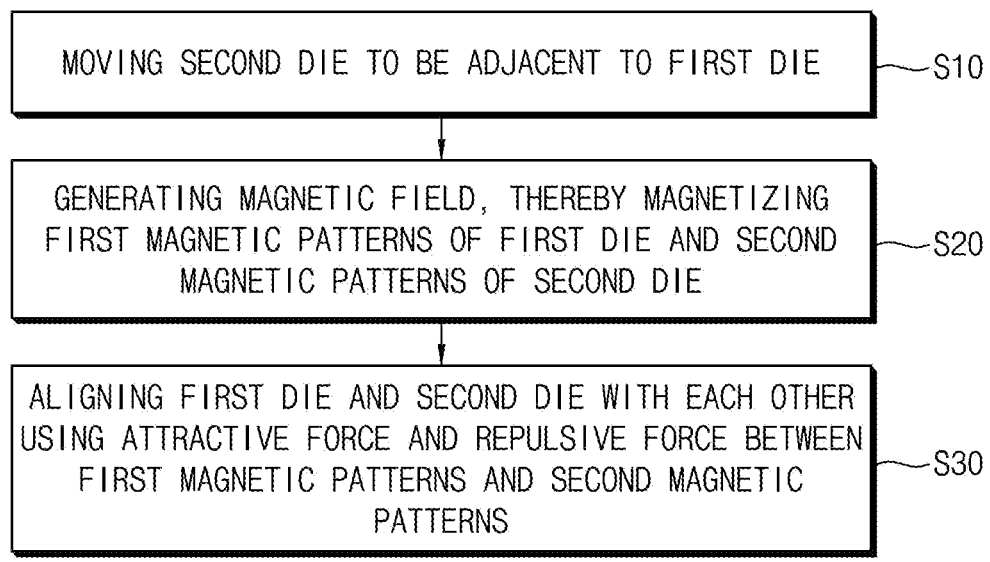
FIG. 4 is a flowchart of a die alignment method according to an embodiment of the present disclosure.

FIGS. 2 and 3 are cross-sectional views explaining a method for aligning a first die and a second die with each other through application of a magnetic field in accordance with an embodiment of the present disclosure. In FIGS. 2 and 3, cross-sections of the first die and the second die are shown. FIG. 4 is a flowchart explaining a die alignment method according to an embodiment of the present disclosure.

Referring to FIG. 2, a first die D1 and a second die D2 may be provided. In an embodiment, the first die D1 may be provided on a stage, and the second die D2 may be provided over the first die D1 by a pick-up tool. Each of the first die D1 and the second die D2 may have the form of a plate extending in a first direction X and a second direction Y. In an embodiment, the first direction X and the second direction Y may perpendicularly intersect each other in the same plane. A third direction Z may be perpendicular to each of the first direction X and the second direction Y and may be a vertical direction as well as a thickness direction of the first and second dies D1, D2. The second die D2 may be provided to be disposed in a state of being spaced apart from the first die D1 in the third direction Z.

The first die D1 may include first magnetic patterns 10. For example, the first magnetic patterns 10 may include a ferroelectric material. In an embodiment, the first magnetic patterns 10 may include first upper patterns 11 and first lower patterns 12. The first upper patterns 11 may be disposed adjacent to an upper surface US1 of the first die D1. The first lower patterns 12 may be disposed adjacent to a bottom surface BS1 of the first die D1. Although the first upper patterns 11 and the first lower patterns 12 are shown in an embodiment of FIG. 2 as being exposed by the upper surface US1 and the bottom surface BS1, respectively, embodiments of the present disclosure are not necessarily limited thereto. The first upper patterns 11 may be spaced apart from one another in a horizontal direction (e.g., the first direction X and/or second direction Y). The first lower patterns 12 may be spaced apart from one another in the horizontal direction. The first upper patterns 11 may not vertically overlap with the first lower patterns 12 (e.g., in the third direction Z). For example, in an embodiment one first lower pattern 12 may be disposed to correspond to a region between two first upper patterns 11 disposed adjacent to each other. In an embodiment, side surfaces 11s of the first upper patterns 11 may be aligned with side surfaces 12s of the first lower patterns 12 disposed adjacent thereto, respectively. Here, alignment of side surfaces means that the side surfaces are disposed in the same plane, and means that the side surfaces are disposed on the same vertical line in a cross-sectional view (e.g., a vertical line extending in the third direction Z). The side surface 11s of the first upper pattern 11 and the side surface 12s of the first lower pattern 12 aligned with each other may be directed in opposite directions, respectively. The first upper patterns 11 may be used to align the second die D2 with the first die D1. The first lower patterns 12 may be used to align the first die D1 with a die, a wafer or a stage under the first die D1.

The second die D2 may include second magnetic patterns 20. For example, the second magnetic patterns 20 may include a ferroelectric material. In an embodiment, the second magnetic patterns 20 may include second upper patterns 21 and second lower patterns 22. The second upper patterns 21 may be disposed adjacent to an upper surface US2 of the second die D2. The second lower patterns 22 may be disposed adjacent to a bottom surface BS2 of the second die D2. Although the second upper patterns 21 and the second lower patterns 22 are shown as being exposed by the upper surface US2 and the bottom surface BS2, respectively, embodiments of the present disclosure are not necessarily limited thereto. The second upper patterns 21 may be spaced apart from one another in the horizontal direction (e.g., the first direction X and/or second direction Y). The second lower patterns 22 may be spaced apart from one another in the horizontal direction. The second upper patterns 21 may not vertically overlap with the second lower patterns 22. One second upper pattern 21 may be disposed to correspond to a region between two second lower patterns 22 disposed adjacent to each other. In an embodiment, side surfaces 21s of the second upper patterns 21 may be aligned with side surfaces 22s of the second lower patterns 22, respectively.

The side surface 21s of the second upper pattern 21 and the side surface 22s of the second lower pattern 22 aligned with each other may be directed in opposite directions, respectively. Positions and arrangement of the second magnetic patterns 20 in the second die D2 may correspond to positions and arrangement of the first magnetic patterns 10 in the first die D1. The second lower patterns 22 may be used to align the second die D1 with the first die D1. The second upper patterns 21 may be used to align the second die D2 with another die to be disposed on the second die D2.

Referring to an embodiment of FIG. 3, the first die D1 and the second die D2 may have substantially the same shape and area. When the first die D1 and the second die D2 vertically completely overlap each other through alignment thereof, the first upper patterns 11 may not vertically overlap with the second lower patterns 22. For example, when the first die D1 and the second die D2 are aligned with each other, one first upper pattern 11 may be disposed between two second lower patterns 22 adjacent to each other. Opposite side surfaces 11sa and 11sb of the first upper pattern 11 may be vertically aligned (e.g., in the third direction Z) with facing side surfaces 22sa and 22sb of the two second lower patterns 22, respectively. For example, one side surface 11sa of the first upper pattern 11 may be vertically aligned with the side surface 22sa of one of the two second lower patterns 22, and the other side surface 11sb of the first upper pattern 11 may be vertically aligned with the side surface 22sb of the other of the two second lower patterns 22 (facing the side surface 22sa of one of the two second lower patterns 22).

In an embodiment, the first magnetic patterns 10 and the second magnetic patterns may be formed in the form of a thin film. As shown in an embodiment of FIGS. 2-3, the first magnetic patterns 10 and the second magnetic patterns 20 may include a horizontally magnetically anisotropic material from among ferroelectric materials. In an embodiment in which a horizontally magnetically anisotropic material is formed in the form of a thin film, magnetization may be easily generated in a plane of the thin film. For example, in an embodiment the horizontally magnetically anisotropic material may be a soft magnetic material such as Fe, Co, FeCo, and NiFe. Alternatively, the horizontally magnetically anisotropic material may be a hard magnetic material such as SmCo. However, embodiments of the present disclosure are not necessarily limited thereto.

Referring to embodiments of FIGS. 2 to 4, the die alignment method may include moving the second die D2 to be adjacent to the first die D1 in block S10, generating a magnetic field H, thereby magnetizing the first magnetic patterns 10 of the first die D1 and the second magnetic patterns 20 of the second die D2 in block S20, and aligning the first die D1 and the second die D2 with each other using attractive force and repulsive force between the first magnetic patterns 10 and the second magnetic patterns 20 in block S30.

Referring to embodiments of FIGS. 2 and 4, after the second die D2 is moved such that the second die D2 is disposed adjacent to the first die D1 in block S10, a magnetic field H capable of magnetizing the first magnetic patterns 10 and the second magnetic patterns 20 may be generated in block S20. For example, the magnetic field H may be generated by flowing current through a solenoid coil surrounding the vicinity of the first die D1 and the second die D2 or disposed around the first die D1 and the second die D2 and, as such, the first die D1 and the second die D2 may be disposed within the magnetic field H. In an embodiment, the magnetic field H may be generated in a direction parallel to an extension direction of the first die D1 and the second die D2. For example, in an embodiment the direction of the magnetic field may be the first direction X. However, embodiments of the present disclosure are not necessarily limited thereto. For example, in an embodiment the direction of the magnetic field may be a direction reverse to the first direction X. The intensity of the magnetic field H may be greater than or equal to an intensity capable of magnetically saturating the first magnetic patterns 10 and the second magnetic patterns 20 in the horizontal direction. By virtue of generation of the magnetic field H, the first magnetic patterns 10 and the second magnetic patterns 20 may be magnetized. In an embodiment in which the first magnetic patterns 10 and the second magnetic patterns 20 may be made of a horizontally magnetically anisotropic material while having the form of a thin film, the first magnetic patterns 10 and the second magnetic patterns 20 may be magnetized in an in-plane direction while having in-plane magnetic anisotropy. For example, the first magnetic patterns 10 and the second magnetic patterns 20 may be easily magnetized in a horizontal direction with respect to a film surface forming a thin film. For example, in an embodiment, the first magnetic patterns 10 and the second magnetic patterns 20 may be magnetized in the first direction X. Here, magnetization in the first direction X may mean that an N pole and an S pole are aligned with each other in the first direction X.

In an embodiment, when the second die D2 is initially disposed adjacent to the first die D1, the first die D1 and the second die D2 may be in a state of being misaligned from each other. For example, as shown in an embodiment of FIG. 2, the second die D2 may be in a state in which only a portion of the second die D2 vertically overlaps with the first die D1, and another portion of the second die D2 (e.g., a right end of the second die D2 in the first direction X) does not vertically overlap with the first die D1. In this embodiment, the first magnetic patterns 10 of the first die D1 and the second magnetic patterns 20 of the second die D2 may at least partially overlap each other (e.g., in the third direction Z). For example, a portion of the first upper pattern 11 of the first die D1 may vertically overlap with the second lower pattern 22 of the second die D2.

When the first magnetic patterns 10 and the second magnetic patterns 20 are magnetized through application of the magnetic field H in a state in which the second die D2 is disposed adjacent to the first die D1 such that the first magnetic patterns 10 and the second magnetic patterns 20 at least partially overlap each other, as described above, the same polarities of the first magnetic patterns 10 and the second magnetic patterns 20 may vertically at least partially overlap each other. For example, the N pole of the first magnetic pattern 10 may vertically at least partially overlap with the N pole of the second magnetic pattern 20, and the S pole of the first magnetic pattern 10 may vertically at least partially overlap with the S pole of the second magnetic pattern 20. For example, the N pole of the first upper pattern 11 may at least vertically partially overlap with the N pole of the second lower pattern 22, and the S pole of the first upper pattern 11 may at least vertically partially overlap with the S pole of the second lower pattern 22. As the same polarities of the first upper pattern 11 and the second lower pattern 22 overlap each other, repulsive force may be exerted between the first upper pattern 11 and the second lower pattern 22.

In a state in which the first die D1 and the second die D2 are not vertically completely aligned with each other, it may be possible to space the first die D1 and the second die D2 apart from each other (e.g., in the third direction Z) through repulsive force of the first upper patterns 11 and the second lower patterns 22. In addition, it may be possible to prevent occurrence of a warpage phenomenon at the second die D2 during alignment between the first die D1 and the second die D2 through repulsive force of the first upper patterns 11 and the second lower patterns 22.

In an embodiment, attractive force may further be exerted between the first upper patterns 11 and the second lower patterns 22. For example, attractive force may be exerted between the first upper pattern 11 and the second lower pattern 22 disposed nearest to the first upper pattern 11 that does not vertically overlap with the first upper pattern 11 from among the second lower patterns 22.

The second die D2 may be moved to be aligned with the first die D1 by the repulsive force and the attractive force exerted between the first upper patterns 11 and the second lower patterns 22 in block S30. In an embodiment, the first die D1 does not move because the first die D1 is fixed to a stage or a wafer, but the second die D2 may be moved by the repulsive and attractive magnetic forces. For example, in a state in which the second die D2 is offset with respect to the first die D1 in the first direction X, the second die D2 may be horizontally moved in a direction reverse to the first direction X by the repulsive force and the attractive force exerted between the first upper pattern 11 and the second lower pattern 22. As the second die D2 moves in the first direction X, the attractive force may gradually increase, and the repulsive force may gradually decrease. As the second die D2 moves in the first direction X, the distance between the first die D1 and the second die D2 may gradually decrease.

The second die D2 may move until the second die D2 is vertically completely aligned with the first die D1, as shown in an embodiment of FIG. 3. For example, the second die D2 may move until the second die D2 vertically completely overlaps with the first die D1. As the area of the second die D2 vertically overlapping with the first die D1 increases, the distance between the second die D2 and the first die D1 in the third direction Z may gradually decrease. When the second die D2 is vertically aligned with the first die D1, only attractive force may be exerted between the first upper patterns 11 and the second lower patterns 22 and there may be no exertion of repulsive force. When the second die D2 is vertically aligned with the first die D1, the second die D2 may be brought into direct contact with the first die D1 by the attractive force between the first upper patterns 11 and the second lower patterns 22. For example, the second die D2 may be disposed directly on the upper surface US1 of the first die D1. In an embodiment, alignment of the second die D2 with the first die D1 and bringing the second die D2 into direct contact with the first die D1 may be achieved substantially simultaneously.

Figure 5:
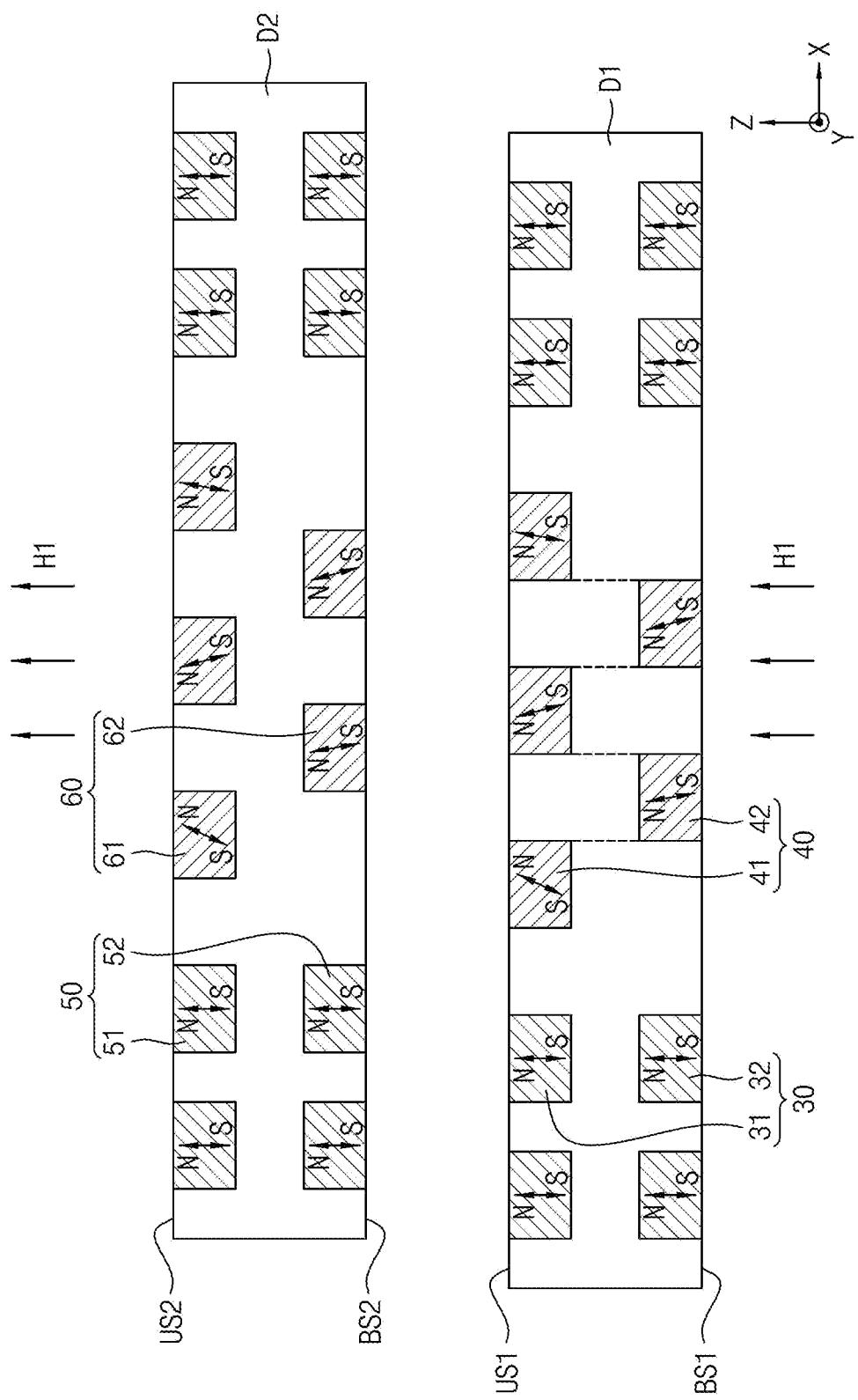
FIGS. 5 and 6 are cross-sectional views of a method for aligning a first die and a second die with each other through application of a magnetic field in accordance with embodiments of the present disclosure.
Figure 6:
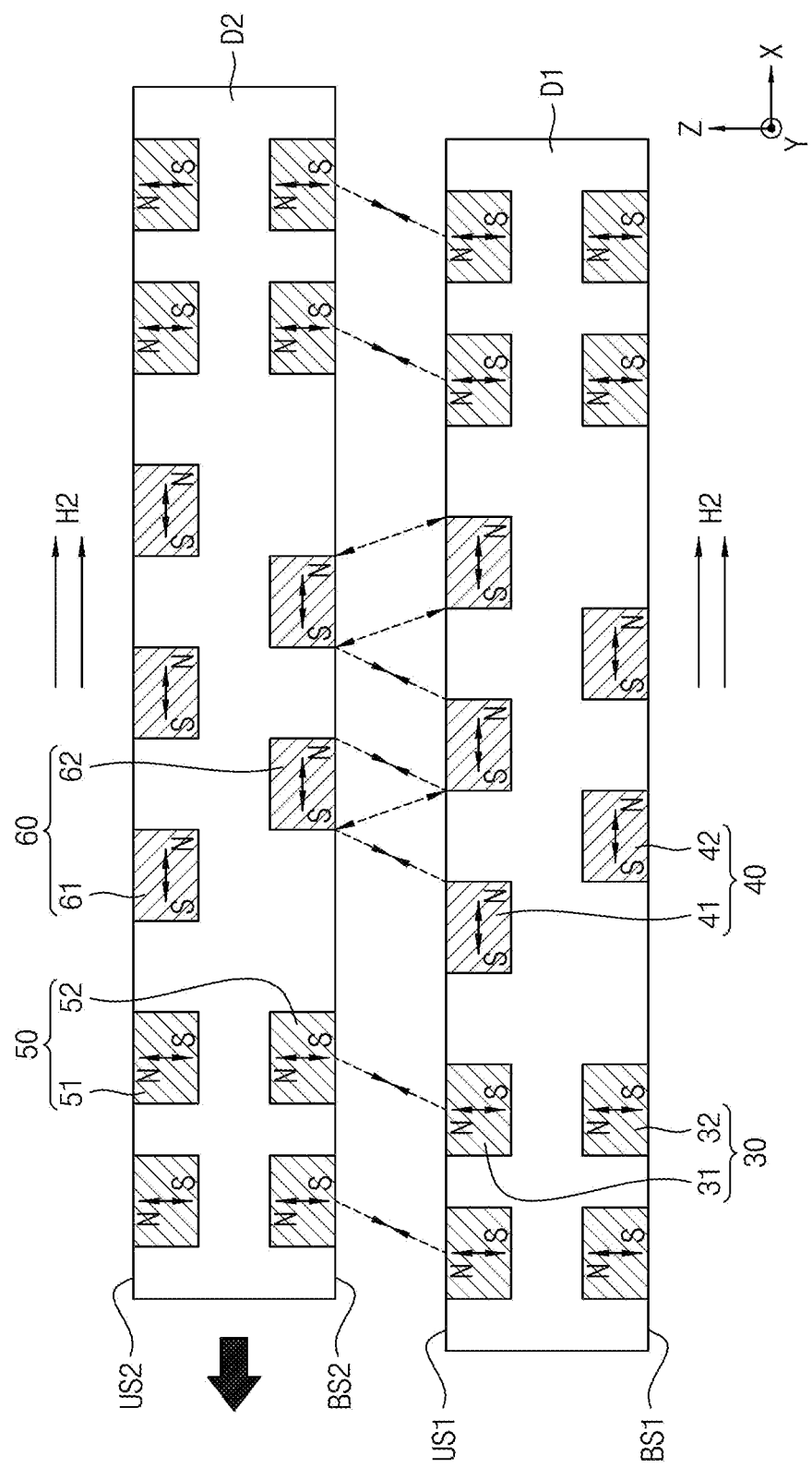
Figure 7:
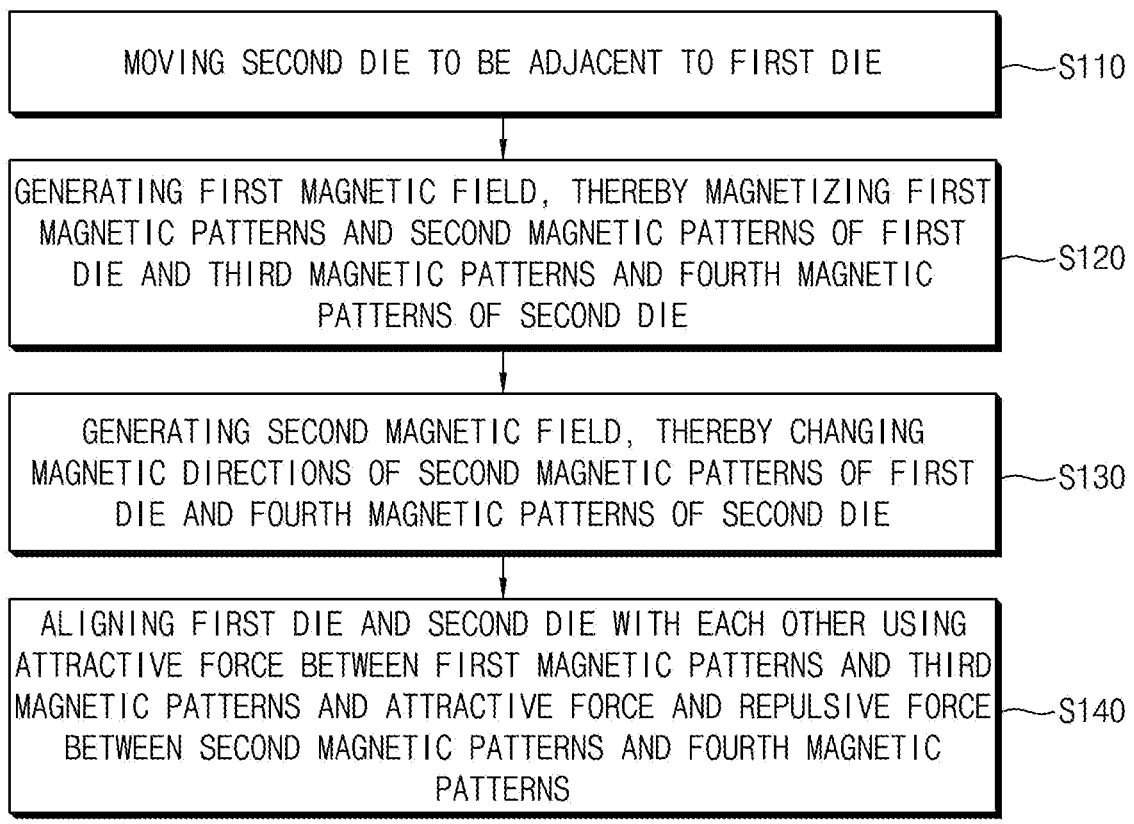
FIG. 7 is a flowchart of a die alignment method according to an embodiment of the present disclosure.

FIGS. 5 and 6 are cross-sectional views explaining a method for aligning a first die and a second die with each other through application of a magnetic field in accordance with embodiments of the present disclosure. In FIGS. 5 and 6, cross-sections of the first die and the second die are shown. FIG. 7 is a flowchart explaining a die alignment method according to an embodiment of the present disclosure.

Referring to an embodiment of FIG. 5, a first die D1 and a second die D2 may be provided. The first die D1 may include first magnetic patterns 30 and second magnetic patterns 40. Each of the first magnetic patterns 30 and the second magnetic patterns 40 may include a ferroelectric material. In an embodiment, the first magnetic patterns 30 and the second magnetic patterns 40 may include different materials, respectively. For example, the first magnetic patterns 30 may include a vertically magnetically anisotropic material, and the second magnetic patterns 40 may include a horizontally magnetically anisotropic material. The vertically magnetically anisotropic material may be a hard magnetic material or a soft magnetic material. For example, in an embodiment the vertically magnetically anisotropic material may be a material such as NdFeB, MnBi, MnAl, MnGa, FeCoB, and FePt. The horizontally magnetically anisotropic material may be a hard magnetic material or a soft magnetic material. For example, in an embodiment, the horizontally magnetically anisotropic material may be a soft material such as Fe, Co, FeCo, and NiFe. Alternatively, the horizontally magnetically anisotropic material may be a hard magnetic material such as SmCo. In an embodiment, the vertically magnetically anisotropic material included in the first magnetic pattern 30 may have greater coercivity than the horizontally magnetically anisotropic material included in the second magnetic pattern 40.

In an embodiment, the first magnetic patterns 30 may be grouped such that the first magnetic patterns 30 are disposed to be adjacent to one another, and the second magnetic patterns 40 may be grouped such that the second magnetic patterns 40 are disposed to be adjacent to one another. For example, the first magnetic patterns 30 may be disposed adjacent to an edge portion of the first die D1 (e.g., an edge in the first direction X and an edge in the direction reverse to the first direction X), and the second magnetic patterns 40 may be disposed at a central portion (e.g., in the first direction X) of the first die D1. As such, the first magnetic patterns 30 may be disposed around the second magnetic patterns 40. However, embodiments of the present disclosure are not necessarily limited thereto. For example, in an embodiment, the first magnetic patterns 30 may be disposed at the central portion of the first die D1 (e.g., in the first direction X), and the second magnetic patterns 40 may be disposed adjacent to the edge portion of the first die D1 (e.g., an edge in the first direction X and an edge in the direction reverse to the first direction X). As such, the second magnetic patterns 40 may be disposed around the first magnetic patterns 30. However, embodiments are not limited to the above described conditions, and positions and arrangements of the first magnetic patterns 30 and the second magnetic patterns 40 may be diversely varied.

In an embodiment, the first magnetic patterns 30 may include first upper patterns 31 and first lower patterns 32. The first upper patterns 31 may be disposed adjacent to an upper surface US1 of the first die D1. The first upper patterns 31 may be horizontally spaced apart from one another. The first lower patterns 32 may be disposed adjacent to a bottom surface BS1 of the first die D1. The first lower patterns 32 may be horizontally spaced apart from one another. The first upper patterns 31 and the first lower patterns 32 may be vertically aligned with each other while being spaced apart from each other. For example, the first upper patterns 31 may vertically completely overlap with the first lower patterns 32. The first lower patterns 32 may be used to align the first die D1 with a die or a wafer disposed under the first die D1. The first upper patterns 31 may be used to align the second die D2 on the first die D1.

The second magnetic patterns 40 may include second upper patterns 41 and second lower patterns 42. In an embodiment, the second upper patterns 41 and the second lower patterns 42 may be arranged in a zig-zag manner when viewed in an X-Z plane. The second upper patterns 41 may be disposed adjacent to the upper surface US1 of the first die D1. The second upper patterns 41 may be horizontally spaced apart from one another in a horizontal direction (e.g., the first direction X and/or second direction Y). The second lower patterns 42 may be disposed adjacent to the bottom surface BS1 of the first die D1. The second lower patterns 42 may be horizontally spaced apart from one another. The second upper patterns 41 and the second lower patterns 42 may not vertically overlap each other. For example, one second lower pattern 42 may be disposed to correspond to a region between two second upper patterns 41 disposed adjacent to each other. In an embodiment, opposite side surfaces of one second upper pattern 41 may be aligned with facing side surfaces of two second lower patterns 42 disposed adjacent to each other, respectively. One side surface of the second upper pattern 41 and one side surface of the second lower pattern 42 aligned with each other may be directed in opposite directions, respectively.

The second die D2 may include third magnetic patterns 50 and fourth magnetic patterns 60. For example, each of the third magnetic patterns 50 and the fourth magnetic patterns 60 may include a ferroelectric material. In an embodiment, the third magnetic patterns 50 and the fourth magnetic patterns 60 may include different materials, respectively. For example, the third magnetic patterns 50 may include a vertically magnetically anisotropic material, and the fourth magnetic patterns 60 may include a horizontally magnetically anisotropic material. The vertically magnetically anisotropic material may be a hard magnetic material or a soft magnetic material. For example, in an embodiment the vertically magnetically anisotropic material may be a material such as NdFeB, MnBi, MnAl, MnGa, FeCoB, and FePt. For example, the horizontally magnetically anisotropic material may be a soft material such as Fe, FeCo, and NiFe. Alternatively, the horizontally magnetically anisotropic material may be a hard magnetic material such as SmCo. The vertically magnetically anisotropic material included in the third magnetic pattern 50 may have greater coercivity than the horizontally magnetically anisotropic material included in the fourth magnetic pattern 60. In an embodiment, the third magnetic patterns 50 may include the same material as the first magnetic patterns 30, and the fourth magnetic patterns 60 may include the same material as the second magnetic patterns 40. However, embodiments of the present disclosure are not necessarily limited thereto.

The third magnetic patterns 50 may include third upper patterns 51 and third lower patterns 52. The third upper patterns 51 and the third lower patterns 52 may be disposed in the second die D2 to correspond to positions and arrangements of the first upper patterns 31 and the first lower patterns 32 in the first die D1, respectively. The third upper patterns 51 and the third lower patterns 52 may be aligned with each other and, as such, may vertically completely overlap each other. In addition, when the first die D1 is vertically aligned with the second die D2, the third upper patterns 51 and the third lower patterns 52 may be aligned with the first upper patterns 31 and the first lower patterns 32 and, as such, may vertically completely overlap with the first upper patterns 31 and the first lower patterns 32.

The fourth magnetic patterns 60 may include fourth upper patterns 61 and fourth lower patterns 62. The fourth upper patterns 61 and the fourth lower patterns 62 may be disposed in the second die D2 to correspond to positions and arrangements of the second upper patterns 41 and the second lower patterns 42 in the first die D1, respectively. For example, when viewed in an X-Z plane, the fourth upper patterns 61 and the fourth lower patterns 62 may be arranged in a zig-zag manner. The fourth upper patterns 61 and the fourth lower patterns 62 may not vertically overlap each other. The fourth lower patterns 62 may be disposed at positions corresponding to regions among the fourth upper patterns 61, respectively. When the first die D1 is vertically aligned with the second die D2, the fourth upper patterns 61 may vertically completely overlay with the second upper patterns 41, and the fourth lower patterns 62 may vertically completely overlap with the second lower patterns 42. The fourth lower patterns 62 may be disposed at positions corresponding to regions among the second upper patterns 41, respectively.

Referring to embodiments of FIGS. 5 to 7, the die alignment method may include moving the second die D2 to be adjacent to the first die D1 in block S110, generating a first magnetic field H1 (FIG. 5), thereby magnetizing the first magnetic patterns 30 and the second magnetic patterns 40 of the first die D1 and the third magnetic patterns 50 and the fourth magnetic patterns 60 of the second die D2 in block S120, generating a second magnetic field H2 (FIG. 6), thereby changing magnetization directions of the second magnetic patterns 40 of the first die D1 and the fourth magnetic patterns 60 of the second die D2 in block S130, and aligning the first die D1 and the second die D2 with each other using attractive force between the first magnetic patterns 30 and the third magnetic patterns 50 and attractive force and repulsive force between the second magnetic patterns 40 and the fourth magnetic patterns 60 in block S140.

After the second die D2 is moved such that the second die D2 is disposed adjacent to the first die D1 in block S110, a first magnetic field H1 capable of magnetizing the first magnetic patterns 30, the second magnetic patterns 40, the third magnetic patterns 50 and the fourth magnetic patterns 60 may be generated in block S120. As shown in an embodiment of FIG. 5, the first magnetic field H1 may be generated in the third direction Z which is a direction normal to each upper surface of the first die D1 and the second die D2. Alternatively, the first magnetic field H1 may be generated in a direction reverse to the third direction Z. The first die D1 and the second die D2 may be disposed within the first magnetic field H1 and, as such, the first magnetic patterns 30 and the second magnetic patterns 40 of the first die D1 and the third magnetic patterns 50 and the fourth magnetic patterns 60 of the second die D2 may be magnetized by the first magnetic field H1.

In an embodiment, although the second die D2 is disposed adjacent to the first die D1, the second die D2 may be disposed adjacent to the first die D1 such that the second die D2 is disposed within the same magnetic field H1 as the first die D1 while being spaced apart from the first die D1 by a distance at which no magnetic force can be generated between the first magnetic patterns 30 and the second magnetic patterns 40 of the first die D1 and the third magnetic patterns 50 and the fourth magnetic patterns 60 of the second die D2. However, embodiments of the present disclosure are not necessarily limited to the above-described conditions.

In an embodiment, the first magnetic patterns 30 and the third magnetic patterns 50 may be made of a vertically magnetically anisotropic material while having the form of a thin film, and may be easily magnetized in a vertical direction with respect to a film surface forming the thin film. For example, the first magnetic patterns 30 and the third magnetic patterns 50 may be magnetized in the third direction Z. In an embodiment, the second magnetic patterns 40 and the fourth magnetic patterns 60 may be made of a horizontally magnetically anisotropic material while having the form of a thin film, but may be magnetized in a vertical direction with a film surface of the thin film by the first magnetic field H1 in the third direction Z. However, as shown in an embodiment of FIG. 5, the magnetization directions of the second magnetic patterns 40 and the fourth magnetic patterns 60 may not be completely parallel to the third direction Z when the first magnetic field H1 is applied.

Referring to embodiments of FIGS. 6 and 7, the first magnetic field H1 may be subsequently removed, and a second magnetic field H2 in a direction perpendicular to the direction of the first magnetic field H1 may then be applied, thereby changing the magnetization directions of second magnetic patterns 40 and the fourth magnetic patterns 60 in block S130. In an embodiment, the second magnetic field H2 may be formed in a direction perpendicular to the first magnetic direction H1. For example, a second magnetic field H2 formed in a first direction X may be generated. The first die D1 and the second die D2 may be disposed within the second magnetic field H2. The intensity of the second magnetic field H2 may be lower than the intensity of the first magnetic field H1. For example, in an embodiment the intensity of the second magnetic field H2 may be lower than the intensity of a magnetic field capable of magnetically saturating the first magnetic patterns 30 and the third magnetic patterns 50 in the first direction X, but may be greater than or equal to the intensity of a magnetic field capable of magnetically saturating the second magnetic patterns 40 and the fourth magnetic patterns 60 in the second direction Y. The magnetization directions of the second magnetic patterns 40 of the first die D1 and the fourth magnetic patterns 60 of the second die D2 may be changed by the second magnetic field H2. Since the second magnetic patterns 40 and the fourth magnetic patterns 60 include horizontally magnetically anisotropic materials, respectively, the magnetization directions of the second magnetic patterns 40 and the fourth magnetic patterns 60 may be easily changed to the horizontal direction by the second magnetic field H2. The magnetization directions of the second magnetic patterns 40 and the fourth magnetic patterns 60 may be changed to an in-plane direction horizontal with respect to a film surface forming a thin film by the second magnetic field H2. Since the first magnetic patterns 30 and the third magnetic patterns 50 are made of a vertically magnetically anisotropic material, which is a curable material, and the intensity of the second magnetic field H2 is lower than the intensity of a magnetic field capable of magnetically saturating the first magnetic patterns 30 and the third magnetic patterns 50 in the first direction X, the magnetization directions of the first magnetic patterns 30 and the fifth magnetic patterns 50 may not be changed or may correspond to the third direction Z when the second magnetic field H2 is applied, but may not be completely parallel to the third direction Z.

As the first magnetic patterns 30 and the third magnetic patterns 50 are magnetized by the first magnetic field H1 in a vertical direction (e.g., the third direction Z), and the second magnetic patterns 40 and the fourth magnetic patterns 60 are magnetized by the second magnetic field H2 in a horizontal direction (e.g., the first direction X), attractive force may be exerted between the first magnetic patterns 30 and the third magnetic patterns 50, and attractive force and repulsive force may be exerted between the second magnetic patterns 40 and the fourth magnetic patterns 60. By the attractive force and the repulsive force, the first die D1 and the second die D2 may be aligned with each other such that the first die D1 and the second die D2 vertically completely overlap each other in block S140. For example, attractive force may be exerted between the first upper patterns 31 of the first die D1 and the third lower patterns 52 of the second die D2. Repulsive force and attractive force may be exerted between the second upper patterns 41 of the first die D1 and the fourth lower patterns 62 of the second die D2. In an embodiment, the second die D2 may be brought into direct contact with the first die D1 simultaneously with alignment of the first die D1 with the second die D2.

In an embodiment, in a state in which the second die D2 is spaced apart from the first die D1 by a distance at which no magnetic force can be generated between the first magnetic patterns 30 and the second magnetic patterns 40 of the first die D1 and the third magnetic patterns 50 and the fourth magnetic patterns 60 of the second die D2 prior to the generation of the second magnetic field H2, the second magnetic field H2 may then be generated, thereby changing the magnetization directions of the second magnetic patterns 40 and the fourth magnetic patterns 60 to the horizontal direction, and the second die D2 may then be moved such that the second die D2 is positioned nearer to the first die D1 and, as such, magnetic force may be exerted between the magnetic patterns.

In an embodiment in which the first magnetic patterns 30 and the third magnetic patterns 50, which include a vertically anisotropic material, are disposed at central portions of the first die D1 and the second die D2, respectively, and the second magnetic patterns 40 and the fourth magnetic patterns 60, which include a horizontally anisotropic material, are disposed at edge portions of the first die D1 and the second die D2, respectively, differently from the embodiments of FIGS. 5 and 6, it may be possible to reduce a warpage phenomenon of the second die D2 by repulsive force exerted between the second magnetic patterns 40 and the fourth magnetic patterns 60 upon aligning the first die D1 and the second die D2 with each other through generation of a magnetic field.

Figure 8:
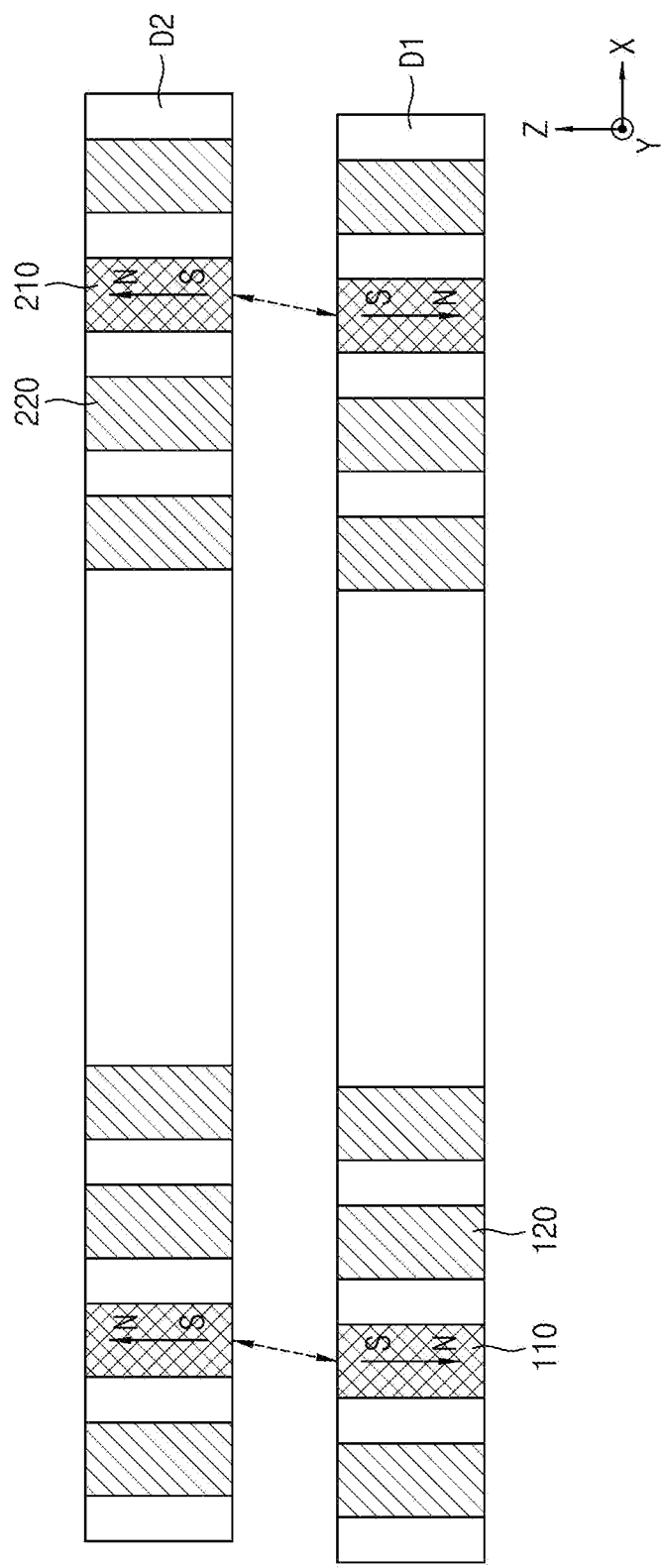
FIGS. 8 and 9 are cross-sectional views of a method for aligning a first die and a second die with each other through application of a magnetic field in accordance with embodiments of the present disclosure.
Figure 9:
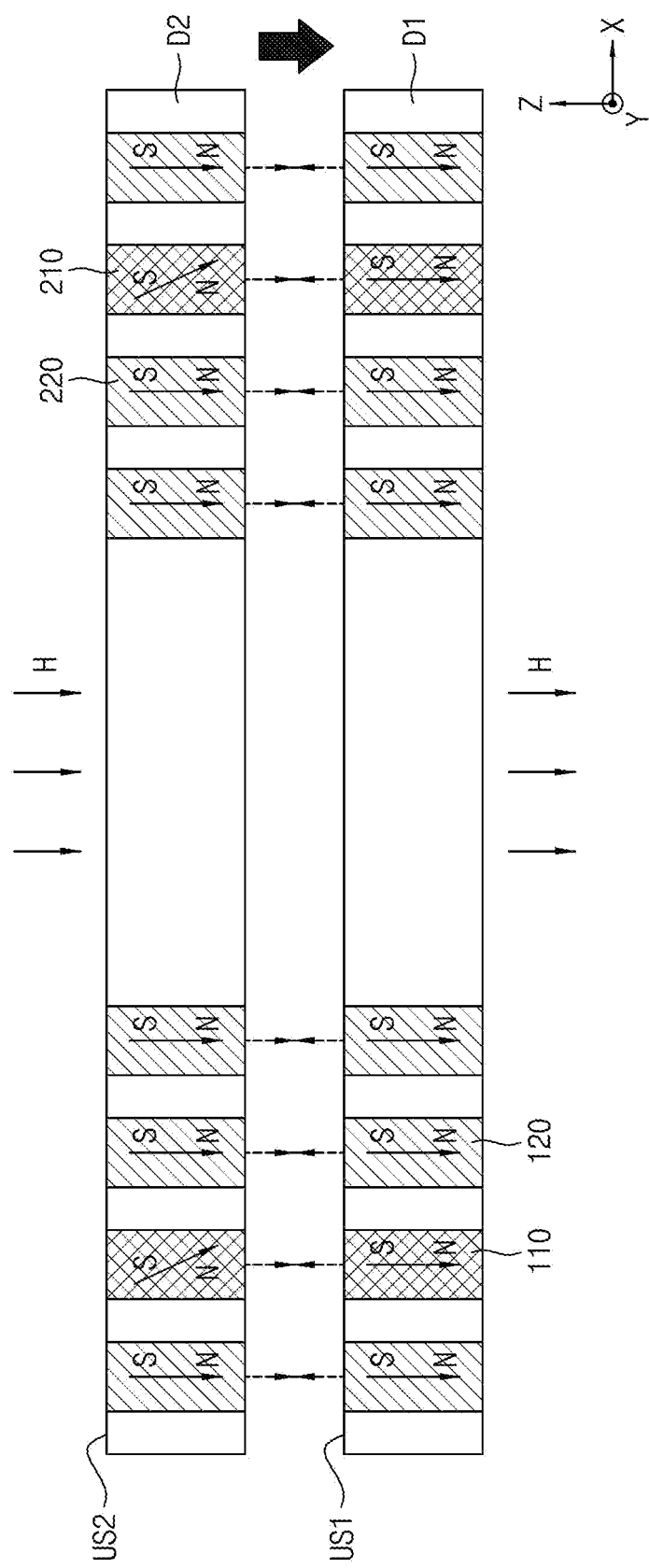
Figure 10:
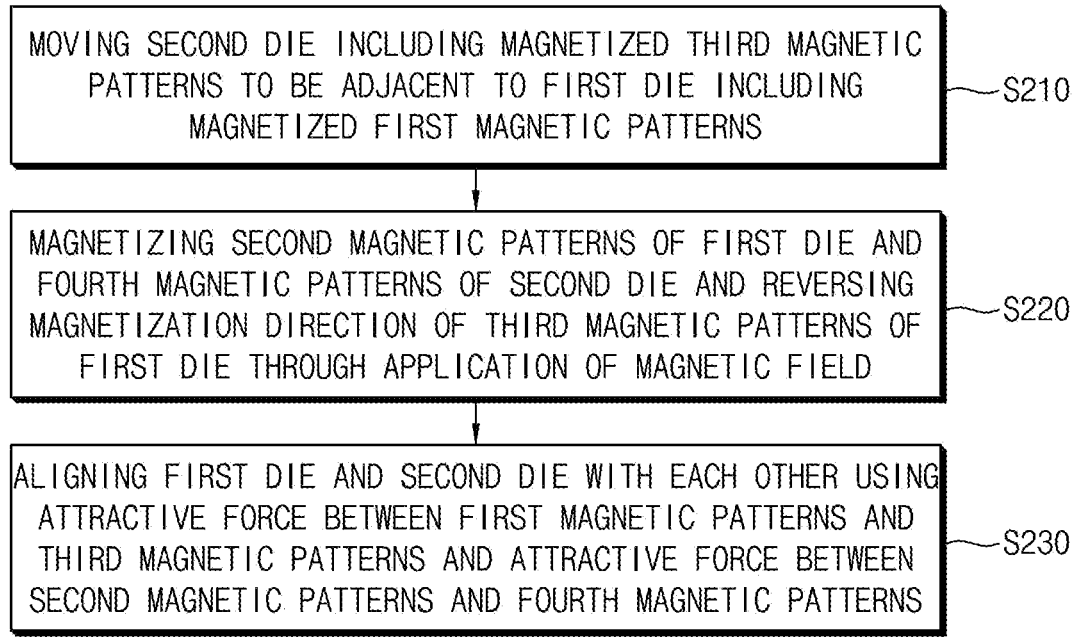
FIG. 10 is a flowchart of a die alignment method according to an embodiment of the present disclosure.

FIGS. 8 and 9 are cross-sectional views explaining a method for aligning a first die and a second die with each other through application of a magnetic field in accordance with embodiments of the present disclosure. In FIGS. 8 and 9, cross-sections of the first die and the second die are shown. FIG. 10 is a flowchart explaining a die alignment method according to an embodiment of the present disclosure.

Referring to an embodiment of FIG. 8, a first die D1 and a second die D2 may be provided. The first die D1 may include first magnetic patterns 110 and second magnetic patterns 120. The first magnetic patterns 110 and the second magnetic patterns 120 may be spaced apart from one another. For example, the first magnetic patterns 110 and the second magnetic patterns 120 may be horizontally spaced apart from one another (e.g., in the first direction X and/or second direction Y). In an embodiment, the first magnetic patterns 110 may be disposed among the second magnetic patterns 120. For example, a first magnetic pattern 110 may be disposed between two adjacent second magnetic patterns 120 in a horizontal direction. However, embodiments of the present disclosure are not necessarily limited to the above-described conditions, and the first magnetic patterns 110 may be disposed at one side of the second magnetic patterns 120. For example, in an embodiment the first magnetic patterns 110 may be disposed nearer to an edge portion of the first die D1 than the second magnetic patterns 120.

In an embodiment, the first magnetic patterns 110 and the second magnetic patterns 120 may include a ferroelectric material. The first magnetic patterns 110 and the second magnetic patterns 120 may include different materials, respectively. The first magnetic patterns 110 may include a semi-hard magnetic material, and the second magnetic patterns 120 may include a soft magnetic material or a hard magnetic material. For example, in an embodiment the semi-hard material may be MnAl, MnGa, or FePt, the hard magnetic material may be NdFeB, SmCo, or MnBi, and the soft magnetic material may be Fe, Co, FeCo, NiFe, or FePt. For example, the semi-hard magnetic material may have greater coercivity than the soft magnetic material, and the hard magnetic material may have greater coercivity than the semi-hard magnetic material.

Although the first magnetic patterns 110 and the second magnetic patterns 120 are shown in an embodiment of FIG. 8 to extend fully through the first die D1 (e.g., in the third direction Z), embodiments of the present disclosure are not necessarily limited thereto, and the first magnetic patterns 110 and the second magnetic patterns 120 may be disposed inside the first die D1 and may not extend to an upper and/or lower surfaces thereof.

The first magnetic pattern 110 in the first die D1 may be in a state of being magnetized before the second die D2 is moved to be adjacent to the first die D1. In an embodiment, the magnetization direction of the first magnetic pattern 110 may be a vertical direction. For example, the first magnetic pattern 110 may be in a state of being magnetized in the third direction Z or a direction reverse to the third direction Z. The second magnetic pattern 120 may not be in a magnetized state.

The second die D2 may include third magnetic patterns 210 and fourth magnetic patterns 220 that are spaced apart from each other in a horizontal direction. The third magnetic patterns 210 and the fourth magnetic patterns 220 in the second die D2 may be arranged to correspond to the arrangement of the first magnetic patterns 110 and the second magnetic patterns 120 in the first die D1. For example, when the second die D2 is vertically aligned with the first die D1, the first magnetic patterns 110 may be vertically aligned with the third magnetic patterns 210, and the second magnetic patterns 120 may be vertically aligned with the fourth magnetic patterns 220.

In an embodiment, the third magnetic patterns 210 and the fourth magnetic patterns 220 may include a ferroelectric material. The third magnetic patterns 210 and the fourth magnetic patterns 220 may include different materials, respectively. The third magnetic patterns 210 may include a semi-hard magnetic material, and the fourth magnetic patterns 220 may include a soft magnetic material or a hard magnetic material. In an embodiment, the third magnetic patterns 210 may include the same material as the first magnetic patterns 110, and the fourth magnetic patterns 220 may include the same material as the second magnetic patterns 120. However, embodiments of the present disclosure are not necessarily limited thereto.

The third magnetic pattern 210 in the second die D2 may be in a state of being magnetized before the second die D2 is moved to be adjacent to the first die D1. In an embodiment, the magnetization direction of the third magnetic pattern 210 may be a vertical direction. In an embodiment, the magnetization direction of the third magnetic pattern 210 may be reverse to the magnetization direction of the first magnetic pattern 110. For example, the third magnetic pattern 210 may be in a state of being magnetized in the third direction Z or the direction reverse to the third direction Z. The fourth magnetic pattern 220 may not be in a magnetized state.

Referring to embodiments of FIGS. 8 to 10, the die alignment method may include moving a second die D2 including third magnetic patterns 210 in a magnetized state to be adjacent to a first die D1 including first magnetic patterns 110 in a magnetized state in block S210, magnetizing second magnetic patterns 120 of the first die D1 and fourth magnetic patterns 220 of the second die D2 and reversing a magnetization direction of the third magnetic patterns 210 of the first die D1 through application of a magnetic field in block S220, and aligning the first die D1 and the second die D2 with each other using attractive force between the first magnetic patterns 110 and the third magnetic patterns 210 and attractive force between the second magnetic patterns 120 and the fourth magnetic patterns 220 in block S230.

Referring to embodiments of FIGS. 8 and 10, the second die D2 including the third magnetic patterns 210 in a magnetized state, may be moved to be adjacent to the first die D1 including the first magnetic patterns 110 in a magnetized state in block S210. When the second die D2 is disposed adjacent to the first die D1, magnetic force may be exerted between the first magnetic pattern 110 and the third magnetic pattern 210. Since the first magnetic patterns 110 and the third magnetic patterns 210 have reverse magnetization directions, respectively, repulsive force may be exerted between the first magnetic patterns 110 and the third magnetic patterns 210. A warpage phenomenon may occur at the second die D2, which is moved by a pick-up tool, before the second die D2 is disposed on the first die D1. However, such a warpage phenomenon of the second die D2 may be reduced by the repulsive force between the first magnetic pattern 110 and the third magnetic pattern 210.

Referring to embodiments of FIGS. 9 and 10, a magnetic field H may be generated, thereby magnetizing the second magnetic patterns 120 and the fourth magnetic patterns 220, and the magnetization direction of the third magnetic patterns 210 may be reversed in block S220. In an embodiment, the magnetic field H may be generated in a direction perpendicular to upper surfaces US1 and US2 of the first die D1 and the second die D2. In an embodiment, the magnetic field H may be generated in a direction identical to the magnetization direction of the first magnetic pattern 110. However, embodiments of the present disclosure are not necessarily limited thereto and the magnetic field H may be generated in a direction reverse to the magnetization direction of the first magnetic pattern 110 in some embodiments. For example, when the magnetization direction of the first magnetic pattern 110 is reverse to the third direction Z, the direction of the magnetic field H may also be reverse to the third direction Z. The magnetic field H may be generated in a direction reverse to the magnetization direction of the magnetic pattern 210. For example, when the magnetization direction of the third magnetic pattern 210 is the third direction Z, the direction of the magnetic field H may be reverse to the third direction Z. The intensity of the magnetic field H may be greater than or equal to an intensity capable of magnetically saturating the second magnetic patterns 120 and the fourth magnetic patterns 220 in a direction reverse to the third direction Z.

In an embodiment, the magnetization direction of the third magnetic patterns 210 may be changed by the magnetic field H. Since the third magnetic patterns 210 include a semi-hard magnetic material, the magnetization direction of the third magnetic patterns 210 may be changed by the magnetic field H. For example, when the magnetization direction of the third magnetic patterns 210 before generation of the magnetic field H is the third direction Z, the magnetization direction of the third magnetic patterns 210 may be changed to the reverse direction of the third direction Z by the magnetic field H reverse to the third direction Z.

The second magnetic patterns 120 and the fourth magnetic patterns 220 may be magnetized by the magnetic field H. The second magnetic patterns 120 and the fourth magnetic patterns 220 may be magnetized in a direction reverse to the third direction Z by the magnetic field H.

As the magnetization direction of the third magnetic patterns 210 is reversed by the magnetic field H, and the second magnetic patterns 120 and the fourth magnetic patterns 220 are magnetized by the magnetic field H, attractive force may be exerted between the first magnetic patterns 110 and the third magnetic patterns 210, and attractive force may be exerted between the second magnetic patterns 120 and the fourth magnetic patterns 220. The first die D1 and the second die D2 may be vertically aligned with each other by the attractive force between the first magnetic patterns 110 and the third magnetic patterns 210 and the attractive force between the second magnetic patterns 120 and the fourth magnetic patterns 220 in block S230. The second die D2 may be disposed directly on the upper surface US1 of the first die D1 while being aligned with the first die D1.

FIG. 11 is a cross-sectional view of a method for aligning a first die and a second die with each other through application of a magnetic field in accordance with an embodiment of the present disclosure. In FIG. 11, cross-sections of the first die and the second die are shown.

Referring to an embodiment of FIG. 11, a first die D1 and a second die D2 may be provided. The first die D1 may include first magnetic patterns 310. The first magnetic patterns 310 may be horizontally spaced apart from one another. The first magnetic patterns 310 may include a ferroelectric material. The first magnetic patterns 310 may include a vertically magnetically anisotropic material.

The second die D2 may include second magnetic patterns 410 and third magnetic patterns 420. The second magnetic patterns 410 and the third magnetic patterns 420 may be horizontally spaced apart from one another. The second magnetic patterns 410 and the third magnetic patterns 420 may be disposed in the second die D2 at positions at which the second magnetic patterns 410 and the third magnetic patterns 420 are vertically aligned with the first magnetic patterns 310 when the first die D1 and the second die D2 are vertically aligned with each other.

In an embodiment, the second magnetic patterns 410 and the third magnetic patterns 420 may include different materials, respectively. For example, the second magnetic patterns 410 may include a ferroelectric material. The second magnetic patterns 410 may include a vertically magnetically anisotropic material. In an embodiment, the second magnetic patterns 410 may include the same material as the first magnetic patterns 310. The third magnetic patterns 420 may include a diamagnetic material. For example, in an embodiment, the third magnetic patterns 420 may include at least one compound selected from Pb, Cu, Sb, Ag, Au, an Nb—Ti alloy, a Ge—Nb alloy, and ReFOFeAs (Re being La, Ce, Sm, Nd, or Pr). However, embodiments of the present disclosure are not necessarily limited thereto.

The magnetic field H may be generated after the second die D2 is moved to be adjacent to the first die D1. In an embodiment, the magnetic field H may be generated in a direction perpendicular to upper surfaces US1 and US2 of the first die D1 and the second die D2. For example, the direction of the magnetic field H may be a third direction Z or a direction reverse to the third direction Z.

The first magnetic patterns 310, the second magnetic patterns 410 and the third magnetic patterns 420 may be magnetized by the magnetic field H. The first magnetic patterns 310 and the second magnetic patterns 410 may be magnetized in the same direction, and the third magnetic patterns 420 may be magnetized in a direction reverse to the magnetization direction of the first magnetic patterns 310 and the second magnetic patterns 410 by the magnetic field H. For example, as shown in an embodiment of FIG. 11, the first magnetic patterns 310 and the second magnetic patterns 410 may be magnetized in the direction reverse to the third direction Z, and the third magnetic patterns 420 may be magnetized in the third direction Z. As a result, attractive force may be exerted between the first magnetic patterns 310 and the second magnetic patterns 410, and repulsive force may be exerted between the first magnetic patterns 310 and the third magnetic patterns 420. The first die D1 and the second die D2 may be vertically aligned with each other by the attractive force between the first magnetic patterns 310 and the second magnetic patterns 410. In addition, a warpage phenomenon of the second die D2 occurring during alignment of the first die D1 and the second die D2 with each other may be reduced by the repulsive force between the first magnetic pattern 310 and the third magnetic patterns 420.

In accordance with embodiments of the present disclosure, dies may be aligned with each other using magnetic force between ferroelectric materials and, as such, it may be possible to increase accuracy of alignment between the dies. It may also be possible to prevent a warpage phenomenon of a die occurring during movement of the die for die alignment.

While non-limiting embodiments of the present disclosure have been described with reference to the accompanying drawings, it should be understood by those skilled in the art that various modifications may be made without departing from the scope of the present disclosure and without changing essential features thereof. Therefore, the above-described embodiments should be considered in a descriptive sense only and not for purposes of limitation.

What is claimed is:

1. A die alignment method comprising:
vertically aligning a first die comprising first magnetic patterns and a second die comprising second magnetic patterns with each other using magnetic force between the first magnetic patterns and the second magnetic patterns,
wherein each of the first magnetic patterns and the second magnetic patterns comprises a horizontally magnetically anisotropic material, and
wherein the first magnetic patterns and the second magnetic patterns do not vertically overlap each other when the first die and the second die are vertically aligned with each other.

2. The die alignment method according to claim 1, wherein the using the magnetic force between the first magnetic patterns and the second magnetic patterns comprises using repulsive force and attractive force.

3. The die alignment method according to claim 1, further comprising:
generating a magnetic field to magnetize the first magnetic patterns and the second magnetic patterns.

4. The die alignment method according to claim 3, wherein a direction of the magnetic field is parallel to an extension direction of the first die and the second die.

5. The die alignment method according to claim 3, wherein the first magnetic patterns and the second magnetic patterns are magnetized in in-plane directions thereof, respectively.

6. The die alignment method according to claim 1, wherein:

the first magnetic patterns comprise two upper patterns adjacent to each other; and the second magnetic patterns comprise a lower pattern disposed in the second die to correspond to a region between the two adjacent upper patterns when the first die and the second die are vertically aligned with each other.

7. The die alignment method according to claim 6, wherein opposite side surfaces of the lower pattern are vertically aligned with facing side surfaces of the two upper patterns adjacent to each other, respectively.

* * * * *